(12) United States Patent
Demidov et al.

(10) Patent No.: US 6,460,152 B1
(45) Date of Patent: Oct. 1, 2002

(54) HIGH SPEED MEMORY TEST SYSTEM WITH INTERMEDIATE STORAGE BUFFER AND METHOD OF TESTING

(75) Inventors: Vadim Sergeyevich Demidov, St. Petersburgh (RU); Alexander Roger Deas, Edinburgh (GB)

(73) Assignee: Acuid Corporation Limited, Guernsey (GB)

( * ) Notice: Subject to any disclaimer, the term of this patent is extended or adjusted under 35 U.S.C. 154(b) by 0 days.

(21) Appl. No.: 09/659,659

(22) Filed: Sep. 11, 2000

Related U.S. Application Data (63) Continuation of application No. PCT/RU99/00068, filed on Mar. 11, 1999.

(30) Foreign Application Priority Data

Mar. 11, 1998 (GB) .............................. 9805054

(51) Int. Cl.⁷ ............................. G11C 29/00; G11C 7/00
(52) U.S. Cl. ...................................... 714/723; 365/201
(58) Field of Search ................................ 714/718, 719, 714/720, 721, 722, 723; 365/201

(56) References Cited

U.S. PATENT DOCUMENTS

| | | | |
|---|---|---|---|
| 4,460,999 A | | 7/1984 | Schmidt ...................... 371/21 |
| 5,060,230 A | * | 10/1991 | Arimoto et al. ............ 714/719 |
| 5,339,273 A | * | 8/1994 | Taguchi ...................... 365/201 |
| 5,384,784 A | * | 1/1995 | Mori et al. .................. 714/718 |
| 5,436,911 A | * | 7/1995 | Mori .......................... 714/718 |
| 5,557,571 A | * | 9/1996 | Kato .......................... 365/201 |
| 5,570,381 A | * | 10/1996 | Schofield .................... 714/814 |
| 5,668,764 A | * | 9/1997 | Suriekar ..................... 365/201 |
| 5,706,233 A | * | 1/1998 | Ooishi ........................ 365/201 |
| 5,717,652 A | * | 2/1998 | Ooishi ........................ 365/233 |
| 5,761,141 A | * | 6/1998 | Kobashi et al. ............. 365/201 |
| 5,790,559 A | * | 8/1998 | Sato .......................... 714/720 |
| 5,793,685 A | * | 8/1998 | Suma ......................... 365/201 |
| 5,818,772 A | * | 10/1998 | Kuge .......................... 365/201 |
| 5,910,921 A | * | 6/1999 | Beffa et al. ................. 365/201 |
| 5,953,271 A | * | 9/1999 | Ooishi ........................ 365/201 |
| 6,032,274 A | * | 2/2000 | Manning ..................... 714/718 |
| 6,034,904 A | * | 3/2000 | Kuromiya et al. .......... 365/201 |
| 6,119,251 A | * | 9/2000 | Cloud et al. ................ 714/718 |
| 6,173,238 B1 | * | 1/2001 | Fujisaki ...................... 702/117 |
| 6,202,180 B1 | * | 3/2001 | Nose .......................... 714/718 |

FOREIGN PATENT DOCUMENTS

| | | | |
|---|---|---|---|
| DE | 197 13421 | 10/1997 | ......... G11C/29/00 |
| EP | 149 048 | 7/1985 | ......... G01R/31/28 |

\* cited by examiner

Primary Examiner—Albert DeCady
Assistant Examiner—Joseph D. Torres
(74) Attorney, Agent, or Firm—Darby & Darby

(57) ABSTRACT

Automatic test equipment for memory device testing provides continuous high-speed testing by intelligent pausing a timer when a buffer memory is full or nearly full, the timer being paused is capable of properly maintaining refresh and clock functions for semiconductor devices.

15 Claims, 7 Drawing Sheets

HIGH SPEED MEMORY TEST SYSTEM WITH INTERMEDIATE STORAGE BUFFER AND METHOD OF TESTING

This is a continuation of international application Serial No. PCT/RU99/00068, filed Mar. 11, 1999.

TECHNICAL FIELD

The present invention is particularly applicable to test equipment for testing semiconductor memories to make possible the continuous testing of memories at a wafer probe stage or as packaged parts for the purpose of their subsequent repair by means of a laser repair means.

The present invention is particularly applicable to test equipment for testing semiconductor memories to make it possible the continuous testing of memories at a wafer probe stage or as packaged parts for the purpose of their subsequent repair by means of a laser repair means.

BACKGROUND OF THE INVENTION

In the semiconductor industry, devices are fabricated on silicon wafers, typically from 6 to 12 inches in diameter, with typically 400 die per wafer. These are tested using automated test equipment (ATE) driving the die and measuring the response. Each memory device under test is tested by means of a pattern generator generating a sequence of addresses for accessing and exercising the memory matrix. Failure data resulting from comparison of the actual data from the memory under test with expected data is then stored in a second memory for the purposes of repairing procedure or for engineering purposes.

Different schemes of performing testing may be used depending on a test pattern and the type of memory used for storing fault data. During the test process, the location of defective cells in the main memory may be identified to enable the subsequent repair of the device. Other applications of memory test include the examination of electrical and/or functional parameters of the memory for engineering or quality control purposes, or verification of the operation of the memory in different fields of end application.

A test system used for testing memory devices should be able to test each new generation of memory devices at the maximum speed of the new device. When the latest generation of memory devices is manufactured, there should be a test system available which is capable of testing these new memory devices. The test systems shall also be able to record a large number of locations. These factors combine to create a requirement for a large and expensive memory (called the fault capture memory or error catch RAM) in test systems because the fault capture memory must be the same size and operate at the same speed as the memory device under test.

To reduce the amount of RAM, some ATE manufacturers have used a FIFO memory for temporarily storing the fault information. For example, a known memory tester, the "Minitester B" produced by Memory Corporation plc, uses a buffer memory for storing fault data, implemented in a FIFO memory, i. e. first-in-first-out memory. Other examples are Mosaid MS 4100 series tester also using a FIFO, and a tester built by EDA, Italy, which may stop when the FIFO is full. Still another example is a Honeywell INc. system (U.S. Pat. No. 4,718,004) using FIFO buffer for data acquisition. The more detailed description of such type of a memory may be found in "Testing and Testable Design of High-Density Random Access Memories" by Pinaky Mazumder and Kanad Chakraborty, Kluver Academic Publishers, Boston, 1996.

Known is a testing apparatus using a buffer memory for acquiring fault data (see EP-A-0149048), further comprising a means for avoiding the small buffer memory being overfilled by signaling the tester when the number of words read into the buffer exceeds some predetermined value. However, in the known system, the buffer cannot be read when the fault information is written and thus, cannot provide fast fault data transmission to the central control unit.

In another ATE using a buffer memory for storing fault addresses, fault information transmission may be started as soon as the first block of information is formed that saves time greatly. Another important feature of the use of a buffer is that the information about defective cells only is transmitted, not information on all cells, allowing usage of small RAMs as the buffer memory. However, in some cases, where memory under test has a lot of defects, the buffer memory can fail to operate adequately. For example, the above "Minitester B" has a buffer memory of only 40 registers. This means that once a block of 40 defects occurs, the whole timing system halts or slows down, which can cause the rest of the device to look defective because the device is now operating outside the device's timing specification.

Figure 1:
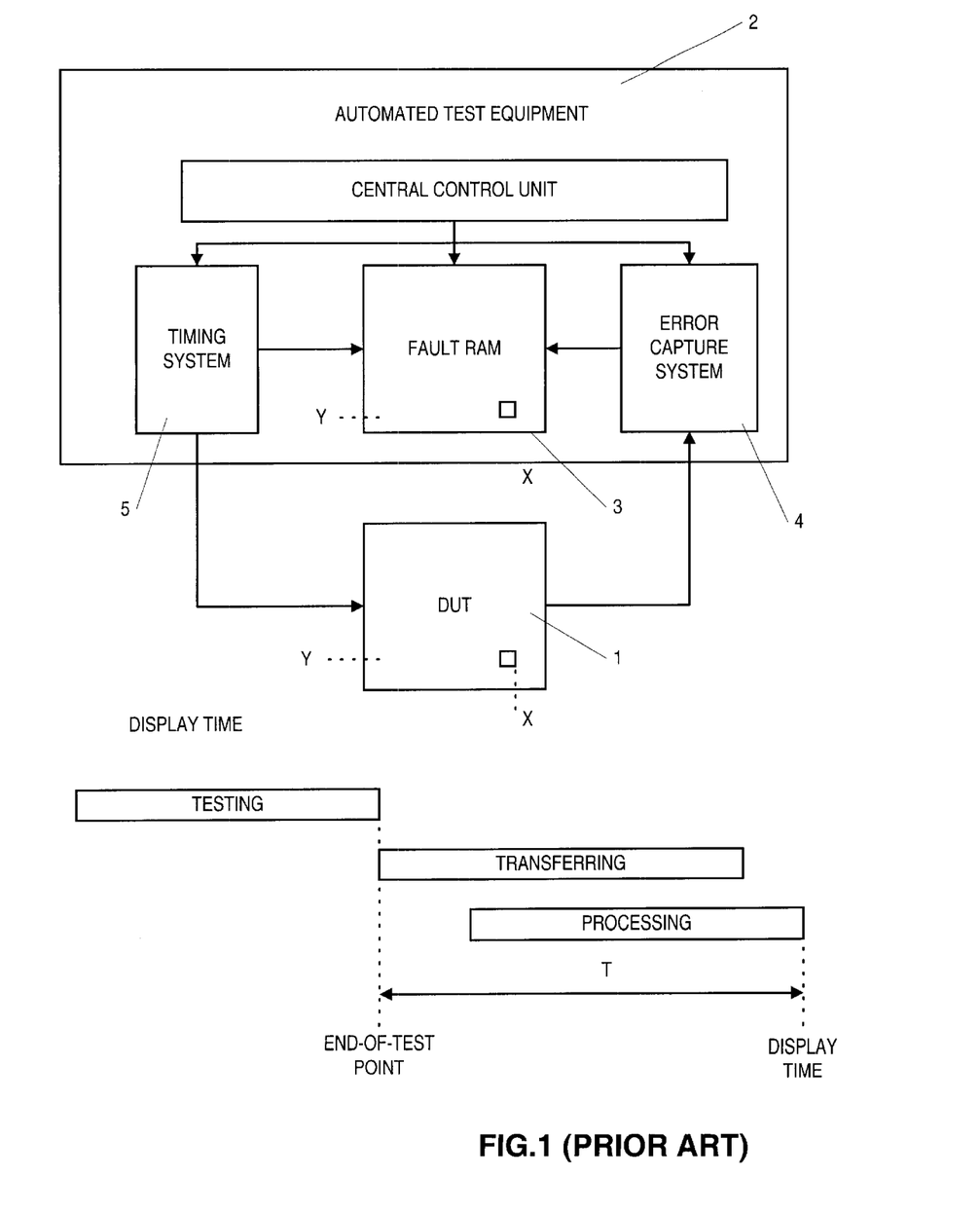
FIG. 1 is a block diagram of the prior art system with bitmap fault memory.

Another well-known type of ATE (see e. g., U.S. Pat. No. 4,460,999) includes usage of a bitmap memory for storing fault information. In bitmap ATE schemes each memory cell has a corresponding row and column address in the bitmap memory. The block scheme and display chart of a typical ATE having bitmap memory for storing fault addresses is shown in FIG. 1. As seen in FIG. 1, a device under test (DUT) 1 is tested by an ATE system 2 with a fault memory capability in the form of a bitmap fault RAM 3. A timing system 5 generates addresses for accessing the DUT. An error capture system 4 is controlled by a central control unit C. The information obtained from the error capture system 4 is stored and/or displayed in the fault RAM 3. The bitmap fault RAM 3 contains the full information about a memory under test, therefore, no situation may occur with overfilling the buffer memory. Another example of a fault bitmap operating at a full tester speed is described in U.S. Pat. No. 5,790,559.

However, the use of a bitmap memory has significant disadvantages. First, bitmap fault memory is large and expensive, which increases the test time cost per memory device. This fault capture memory normally comprises Static RAndom Access Memory (SRAM) and can cost 30% of the total hardware cost of the test system. Second, the bitmap system requires long transferring time even when only a small part of the memory cell is defective. As seen from the picture, one more disadvantage is that fault information transmission can be started only after the whole test is completed, which results in a significant increase of the test time. It is therefore highly desirable to fine an alternative of using large fault capture memory.

The advantage of the present invention is the ability of an ATE system using a small buffer memory to avoid overflow and provide accessible continuous test of a memory device. The buffer memory may be implemented as, but not limited to, a FIFO memory, a single buffer, a double buffer, or multiple buffered circular buffers.

The substance of the present invention is a memory test system adapted to manipulate a timing means in case the buffer memory is full or nearly full. The timing means may be either suspended or slowed down until the buffer memory is at least partially freed. The free space size shall not be less than the maximal possible fault number corresponding to the smallest test pattern, i.e. the test pattern that cannot be interrupted in the course of test proceeding. The important feature of the present invention is that the timing means, being paused, is capable of maintaining properly refresh and clock functions for semiconductor devices. This feature is especially significant for DRAM's, in which case timings, distributed refresh, the maximum interval between burst refresh and clocks are observed.

Thus, in one aspect, the invention is a memory test system comprising a central control unit, a timing means for generating a pattern of addresses, data and control signals for accessing memory elements, a fault logic means for detecting failures in the memory elements and a fault capture memory for storing the resulting fault information, including a high speed buffer memory and a low speed main memory, wherein the high speed buffer memory is operable so that as soon as the first portion of information about faults is received from the fault logic means, information transmission to the central control unit begins and the processing of the information in the main memory is started, while the timing means is signalled when the buffer memory is full or nearly full and stopped or slowed down except for a set of signals maintaining properly refresh intervals within the memory. In accordance with the preferred embodiment, the buffer memory is a FIFO type memory. Preferably, the test system is provided with a means for encoding the fault information to reduce a transmission time. Encoding means are typically a hardware means for assigning each fault vector an identification tag for subsequently storing and transferring this tag.

Another aspect of the present invention is a method of testing semiconductor devices, including a step of generating by a timing means a pattern of addresses, data and control signals for accessing memory elements within the device, a step of detecting failures in the memory elements and a step of processing the resulting fault information, including a step of a high speed processing in buffer memory and a step of a low speed storing and/or displaying in the main memory, wherein the processing of the information is performed so that as soon as the first portion of information about faults is received by the buffer memory, information transmission to a central control unit begins, and the processing of the information in the main memory is started, while the step of generating a pattern of addresses, data and control signals further includes a step according to which the timing means is signaled when the buffer memory is full or nearly full and stopped or slowed down except for a set of signals maintaining properly refresh intervals within the memory (1). In accordance with the preferred embodiment the buffer memory used is a FIFO type memory.

Still another aspect is a computer program for decoding fault information encoded by a hardware encoding means.

For a better understanding of the present invention and to show how the same may be carried into effect, reference will now be made, by way of example, without loss of generality, to the accompanying drawings in which.

The invention will now be described, without loss of generality, with the aid of an example embodiment.

Figure 2:
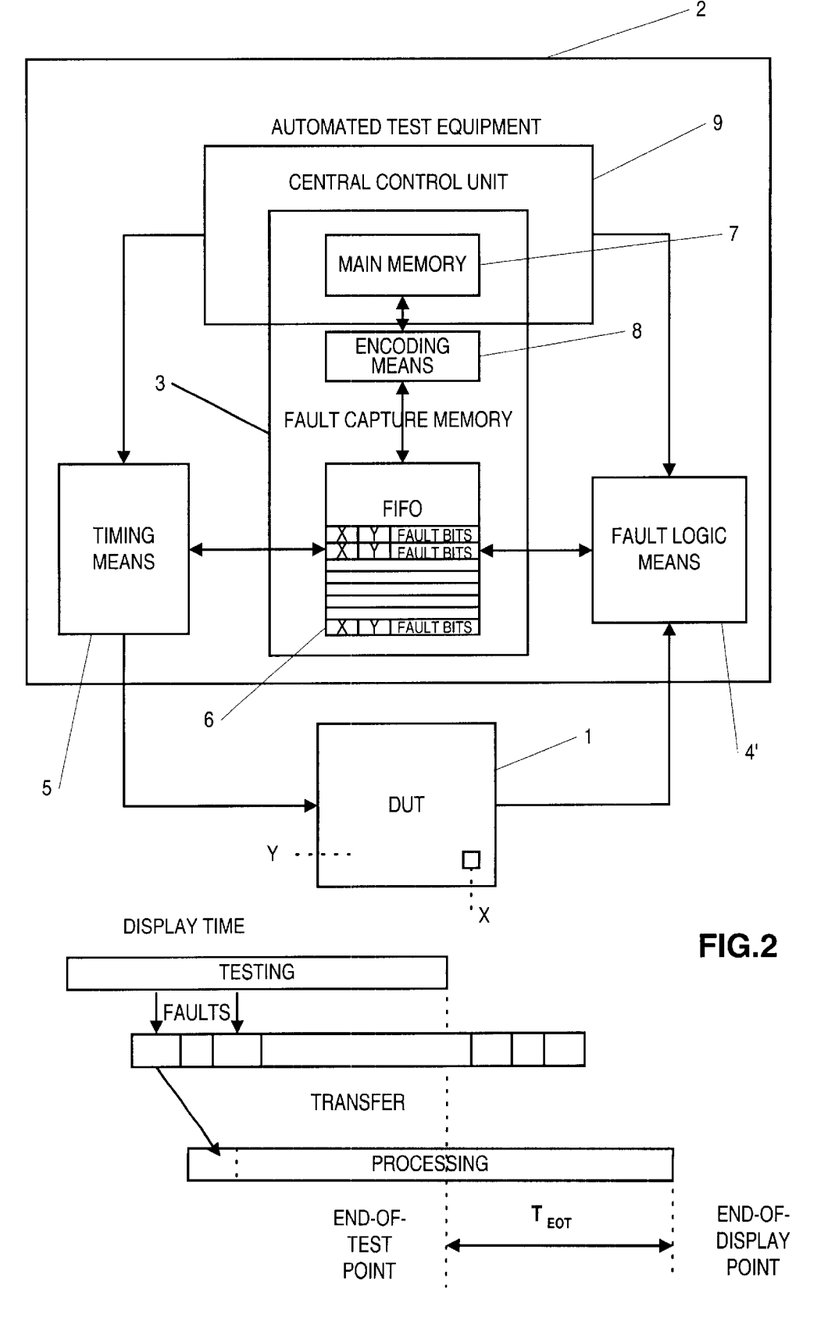
FIG. 2 is a block diagram of the system in accordance with the present invention with a FIFO fault memory.

A block scheme of the present invention is shown in FIG. 2. As seen in the figure, a device under test (DUT) 1 is tested by an ATE 2 with a fault capture memory 3, a fault logic means 4' and a timing means 5. The fault capture memory 3 consists of a high speed FIFO memory 6, a low speed main memory 7 for storing or processing the information obtained from the DUT and an encoding means 8 for coding fault vectors. The FIFO 6 is connected to the timing means 5 for generating delay timing signals. A central control unit 9, that may be a computer, controls the whole process.

The system operates as follows. First, the timing means 5 generates an appropriate sequence of address data and control signals for accessing memory elements within the DUT 1. In accordance with data retrieved from the DUT 1 and expected data, the fault logic means 4' forms fault vector and stores it in the FIFO memory 6. As soon as the small high speed FIFO memory 6 receives the first portion of information about faults, information transmission to the processing unit begins and the processing may be started. A portion of information shall have a minimal possible size sufficient for its transmission. The fault capture memory 3 in accordance with the invention includes also an encoding means 8. The encoding means 8 assigns each fault vector some identification tag for subsequent referring to this tag for fault information storing purposes. The storing of this tag instead of storing the whole information of a fault vector including row, column, DQ bits allows for significantly reducing the necessary amount of the fault capture memory. The main memory 7 of the fault capture memory may be, but not necessarily, located in the central control unit 9. The fault data transferred to the main memory 7 within the central control unit 9 may be stored in the form of a fault vector or it may be expanded to the form of a bitmap matrix or any other form suitable for storing and displaying the information.

Using a small high speed FIFO memory where fast information transmission is necessary, and a large but low speed main memory where speed is not limiting the process, instead of one big fault bitmap RAM, provides for significant improvement in the fault capture memory performance characteristics. The precise method of storing the fault information in the FIFO memory, e.g. in the form of a fault vector, makes it possible to add some useful information to the vector, e.g. the vector may include a test ID tag, or any other information.

To prevent the FIFO memory from overflow, the ATE in accordance with the present invention contains the feedback line from the FIFO 6 to the timing means 5. When the FIFO is full or nearly full, the timing means is signalled and paused or slowed down. The important feature of the present invention is that the timing means 5, being paused, pauses the address generator and jumps to a set of timing states to maintain refresh and clock functions properly for the semiconductor devices under test.

Figure 3:
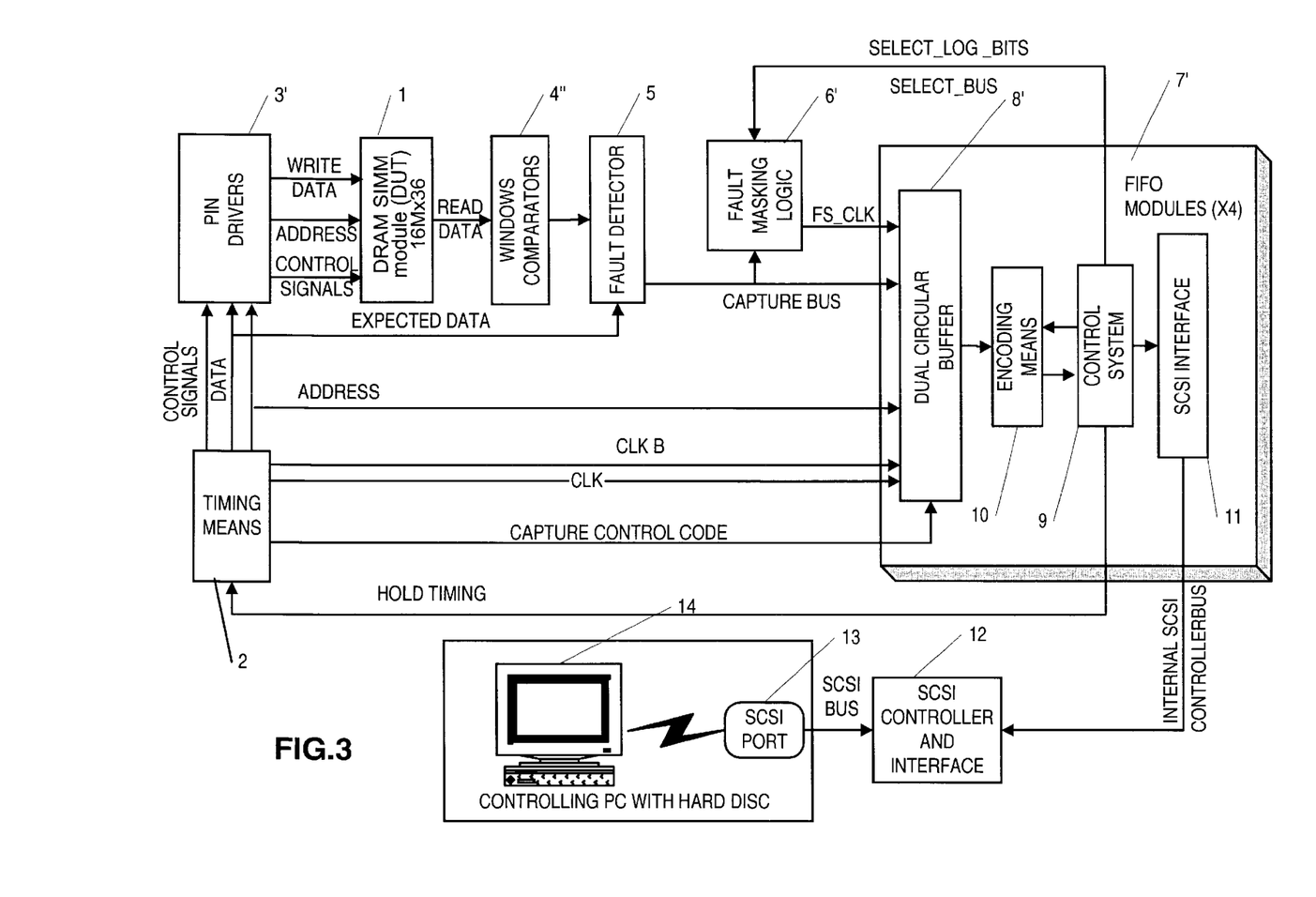
FIG. 3 shows one of the embodiments of the memory test system in accordance with the present invention using a high-speed fault capture memory having a FIFO type structure with the capability of suspending or slowing down the timing means when the FIFO is full or almost full.

In FIG. 3 an example embodiment of the memory test system in accordance with the proposed invention is presented. The system shown is intended for testing a semiconductor memory 1 (that is called herein "device under test", DUT), for example of a type DRAM SIMM module 16M×36. The system contains a timing means 2 for generating delay timing signals providing an appropriate sequence of addresses, data and control signals for accessing memory elements within the DUT1. The read data obtained from the DUT is compared with predetermined levels of "0" and "1" in a window comparator means 4". From the window comparator means 4" this data in digital form is entered into a fault detector means 5 which compares real data with expected data coming from the timing means 2. Taking into account the DUT width, all the bits not used are masked out in the fault masking logic 6'. A delay equalizer means (not shown) for delaying addresses, clock data and capture control data to compensate the round trip delay may be used after the fault detector means 5. The system shown in FIG. 3 uses a FIFO module 7' comprising a dual circular buffer 8' connected to a control system 9. The FIFO is emulated using an SRAM cache of 256 Kb to store the fault address, the data bits with the fault and other parameters. As faults are detected, or after each test pattern is run, the fault store is downloaded through a SCSI interface 11.

To reduce the transmission time, before being transmitted to the control system 9, the fault vectors may be encoded in an encoding means 10 by assigning them identification (ID) tags for subsequently storing and transferring this tag along with a part of fault vector that differs from the previous fault vector. For example, if a new fault is determined having the same row and DQ addresses as the previous one having ID tag assigned, the fault data of a new fault may consist of a column address only and the same ID tag. Thus, the necessary amount of a capture memory space may be reduced greatly.

Figures 4A, 4B:
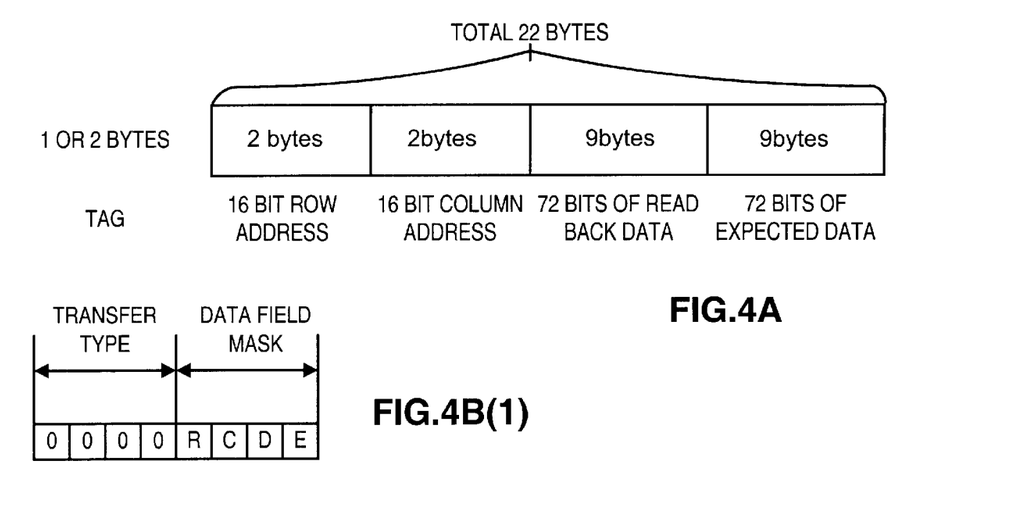
FIG. 4 is a block scheme illustrating the encoding of fault information by assigning tags to fault vectors.
Figure 4B:
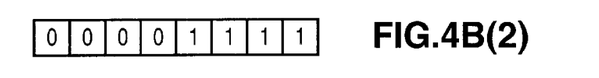
Figure 4C:
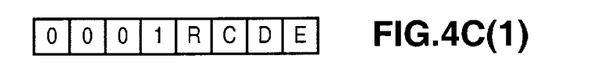
Figure 4D:
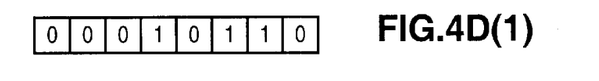

The operation of the encoding means 10 will be further explained in detail with reference to FIG. 4. Suppose, a fault vector contains 16 bit row address, 16 bit column address, 72 bits of read back data and 72 bits of expected data (see FIG. 4a). The transfer of this fault information will require transmitting total 2+2+9+9=22 bytes. The corresponding ID tag may be represented in the form of a 1 or 2 additional bytes, as shown in FIG. 4b(1). The first half of this tag may be, for example, a transfer type information (4 bits) and the second half may be a data field mask (4 bits).

There are several possible transfer types, the typical one being transfer type "0". In this case the fields that correspond to "1"s in the field mask only shall be transferred. Since the most frequently occurring faults represent a sequence of the same data patterns read back from the consecutive addresses going in an ascending or descending order, the next fault address most likely will differ from the previous one in one coordinate only. So this address field shall be transferred which contains 2 bytes of information only.

Thus, though the whole information shall be transferred for the first fault vector, i.e. total 22 bytes of fault vector +1 byte of ID tag=23 bytes, as shown in FIG. 4b(2), just 3 bytes of information may be transferred for the next fault vector which differs in column address only, including 1 byte of transfer type and 2 bytes of the column address (see FIG. 4b(3)).

The transfer type "1" corresponds to a situation when at least one of the row and column addresses have changed and both the read back data and expected data fields have changed, but in one bit only. In this case the corresponding data fields will have "1"s (see FIG. 4c(1)). Setting out "1" in some field means that a single byte will be transferred, indicating the position of this bit inside the field which differs from the previous data pattern.

The decoding operation is performed as follows. A computer program analyses a transfer type field of the first byte of transferred data, which is a TAG identifier, to define a transfer type. In case the transfer type is "0", the program analyses the consequent data bits of a data field mask. In case of non-zero bit in this field a corresponding number of bites are recognized as a part of fault vector shown in FIG. 4a, e.g. the next two bytes are identified as a "row address".

In case the transfer type is "1", the data field mask is analysed in a similar way; i.e. bit "1" (a non-zero bit) indicates that the next byte in the data flow is the number of a bit that have changed and, hence, all the previous values of the field shall be retrieved, while the bit having this actual number is inverted. It is appreciated that a computer program for implementing the above decoding operations can easily be created by a specialist in the art.

Each of the FIFO modules 7 operates so as, when fault vectors are being written in one buffer memory 8, another buffer memory is read thorugh the encoding means 10 into a capture subsystem 9 and its contents are transmitted through an internal SCSI controller bus into a SCSI controller 12. When the buffer 8 being written is full, the buffers change their roles and a new operation cycle begins. In case one of the buffers is full or nearly full, while the other is not freed yet, the timing system 2 receives a hold timing signal to suspend the operation of slow it down. At that moment the timing system 2 jumps to a loop to maintain properly refresh and clock functions but without altering the address. The fault data from the controller 12 is downloaded through a SCSI port 13 to a controlling computer 14 which preferably holds the accumulated data in a encoded format. The fault data may be represented also in a bitmap format for viewing the faults.

Under some test conditions the tester performs a logical operation on all data (DQ) planes of the DUT where there is either a fault or the contents of the planes are different within a certain address window. The present invention can perform the analysis, or any other operation to generate permuted data as an alternative to the real 1s and 0s data.

Alternatives to use of the FIFO to provide the fault capture memory in a memory test system is any other register or content addressable store or RAM containing a list of address fail data and the data bit or bits with the failure.

Figure 5:
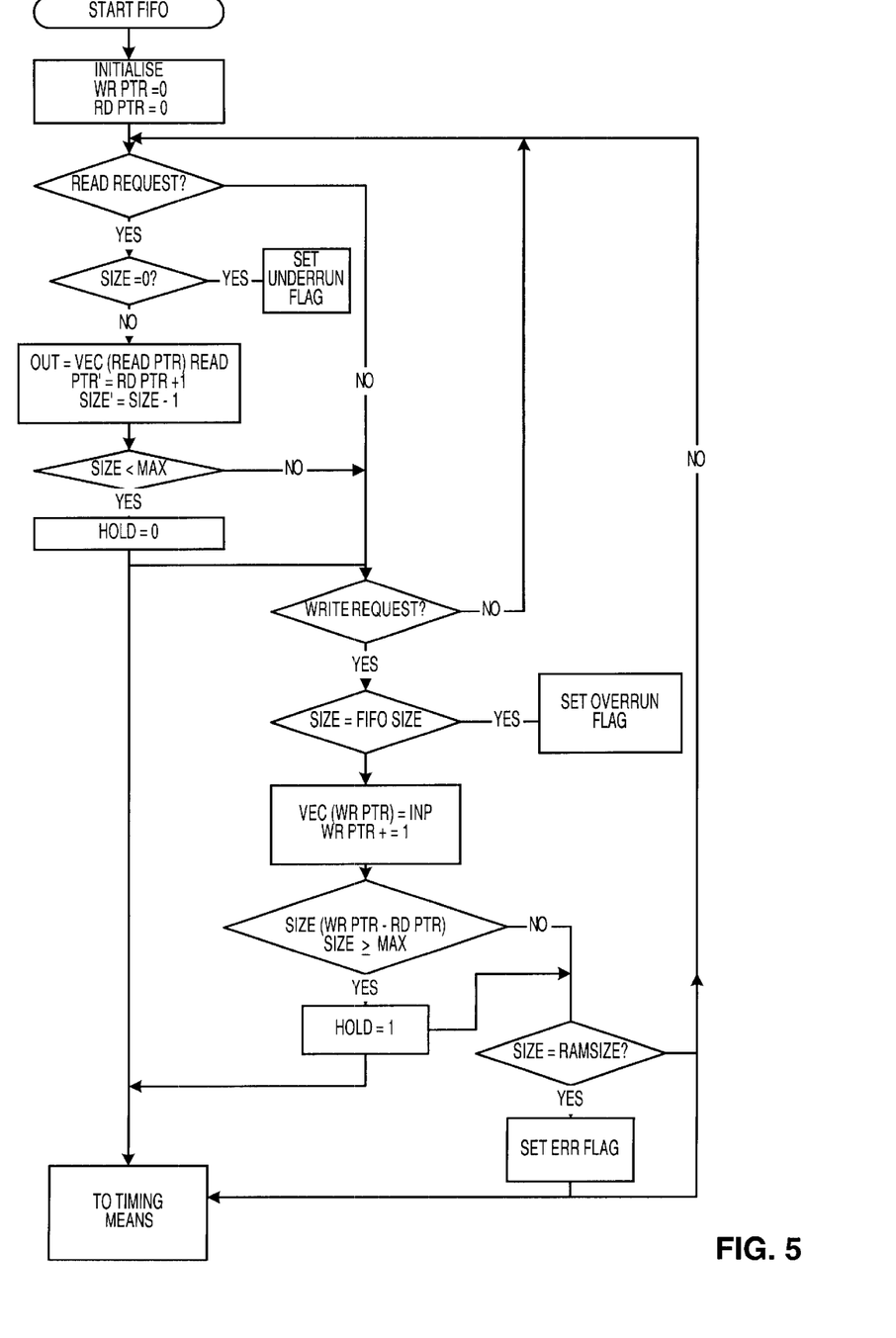
FIG. 5 is a flow chart of a timing means operation in accordance with the present invention.

In FIG. 5 an example flow chart of the timing means operation in memory tester using a single FIFO buffer in accordance with another embodiment of the present invention is shown. As seen in the figure, upon being started, the timing means checks whether a hold timing signal from the FIFO modules 7 is received and then either performs the next test cycle for a DUT, or stops testing while maintaining clocks, refresh and running "no-operation" (NOP) cycles. In some ATE systems the pattern generator instead of the timing system controls this function, such as address hold.

Figure 6:
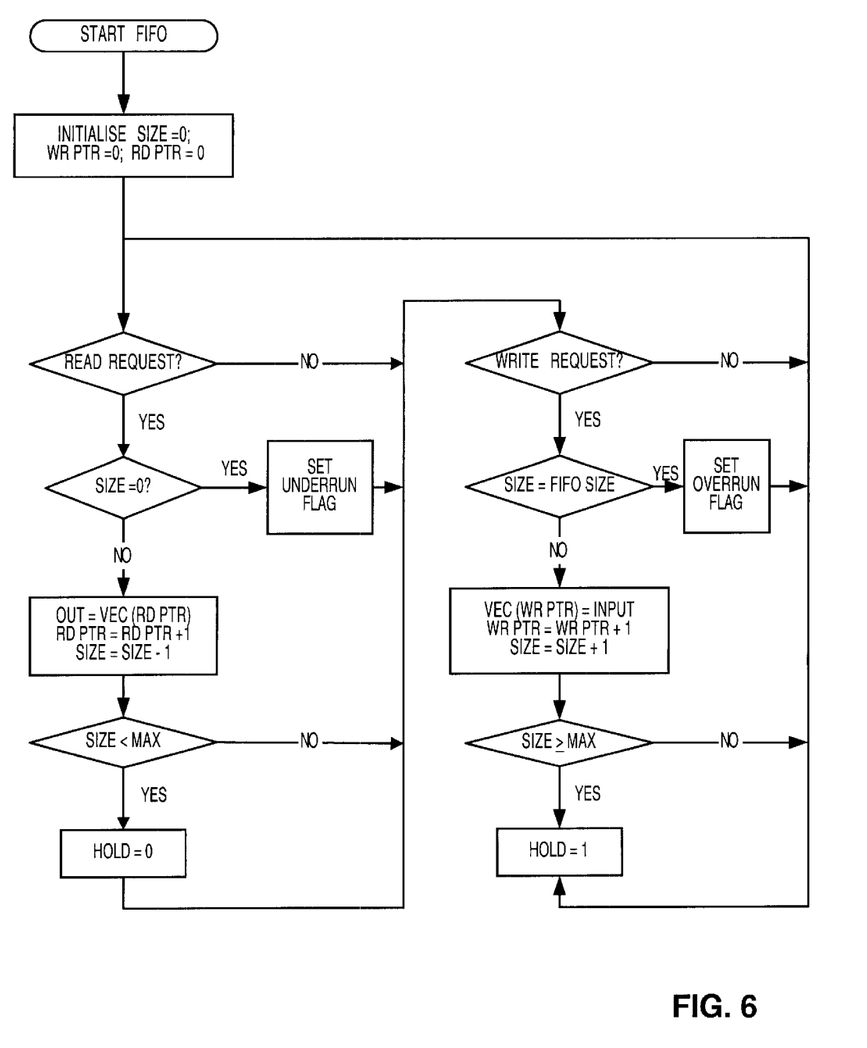
FIG. 6 is a flow chart of the method of FIFO operation in accordance with one embodiment of the present invention.

In FIG. 6 an example flow chart of the FIFO operation in accordance with the embodiment of the present invention using one single FIFO module is shown. The FIFO flow chart operation consists of two sub-cycles executed consequently in the course of a testing operation. A typical FIFO buffer may be represented as a temporary storage of a fault vectors allowing Read and Write operations. The number of a vector to be read is shown by a Read Pointer (Rd PTR) while the number of a vector to be written is shown by a Write Pointer (Wr PTR). The empty FIFO is then characterized by the following conditions:

Wr PTR=0, Rd PTR=0, Size=0, where the Size is a total number of fault vectors stored in the FIFO. Upon receipt of the Read request from the timing means, the contents of the FIFO is checked, and if nothing is to be read, the Write request is processed in turn. If some information was read from the FIFO, the number of Rd PTR increases by "1" and the Size decreases by "1" correspondingly. The next step is to check whether the Size is within the predetermined maximal feasible (MAX) range. The maximal admissible Size may be defined as MAX=FIFO Size-Page Size-Margin, where the FIFO Size is the actual total number of words in the given FIFO, where a word is the space required to store the address and data to identify fail bit, Page Size is the maximal number of fault vectors that may be generated by a page mode piece of test that cannot be interrupted, and Margin is some additional spare space that may be provided for a certain kind of information, for example, the number of pipe delays needed to stop the timing system. In some cases the additional space may be provided for such parameters as temperature or expected data.

After checking the FIFO contents, a HOLD=0 signal may be transmitted to the timing means, i.e. the operation mode of the timing means is not to be changed, but the timing system jumps to a hold cycle, clocks are maintained, address do not change.

Otherwise, the Write subcycle is started by checking whether a Write request has been received. If no Write request is received, the Read subcycle is repeated. If some fault information is to be written, the free FIFO space is checked first to determine the possibility of adding the information to a buffer. In case the buffer is full, an overrun Flag is set to show abnormal FIFO operation. If the free space is within the permitted range, a new fault vector is written, afterwards the number of Wr PTR increases by "1" also. The next step is to check again if the Size is still beyond the admissible range, and if an overflow occurs, an error signal is reordered. This only occurs in the event of a design error.

Figure 7:
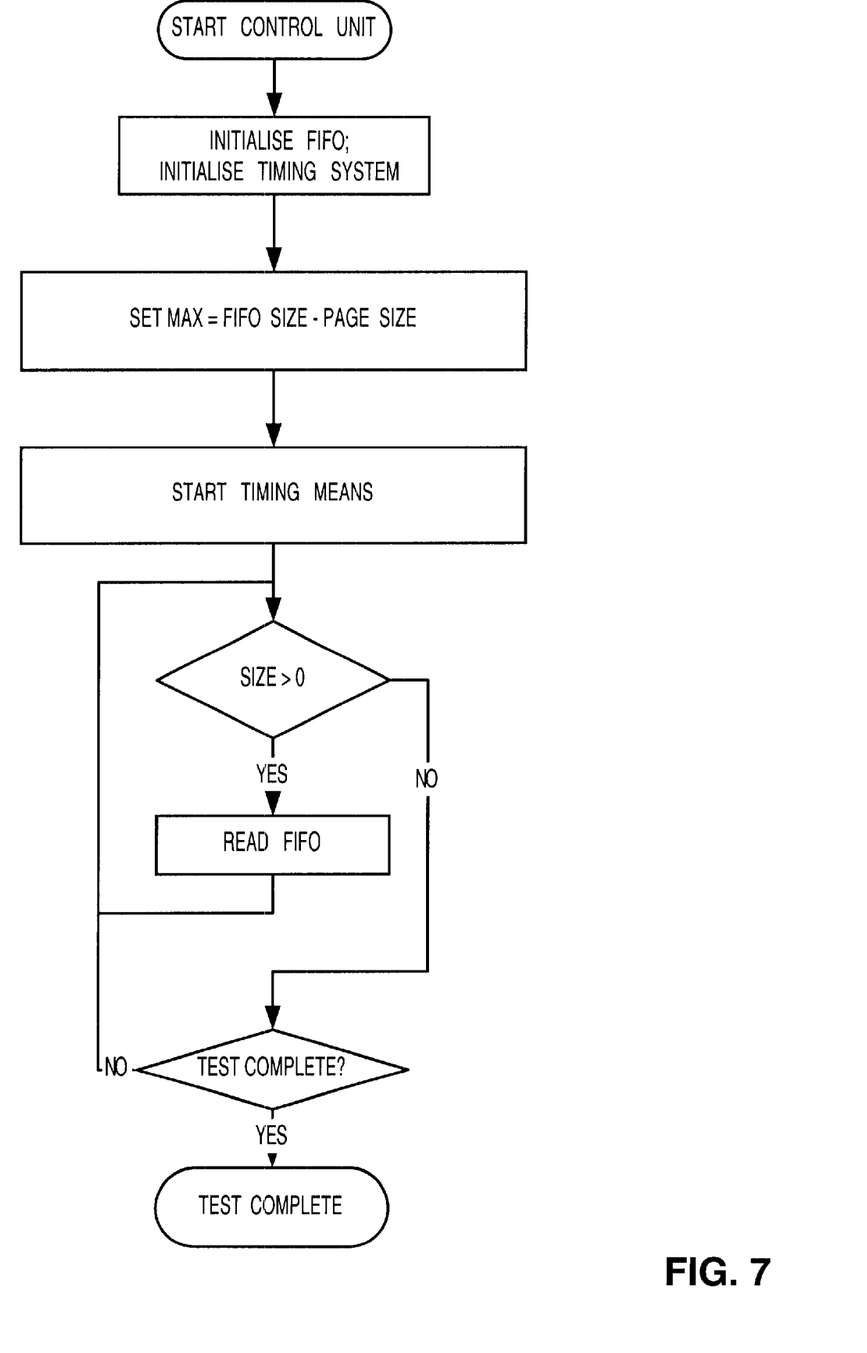
FIG. 7 is a flow chart of a control unit operation in accordance with the present invention.

In FIG. 7 an example flow chart of the control unit operation in memory tester using a single FIFO buffer in accordance with the present invention is shown. As seen in the figure, upon being started, the control unit initializes the FIFO and timing means operation, sets the predetermined admissible MAX value and starts the timing means. The function of the control unit is to check the Read sub-cycle operation of the buffer until the test is complete.

Thus, the main advantage of the proposed ATE operation scheme is the ability of continuous test operation regardless of the test cycle duration and the amount of fault information to be processed in the course of the test.

For example, suppose the FIFO depth is 256 K, Burst SCSI data rate is 40 MB/sec. For a 20 nsec tester cycle and (4 byte address+5 byte data)=9 byte of information to be transferred each time, the FIFO is filled at a maximal rate of 50 MHz×9 bytes=450 MB/sec. The capacity of FIFO buffer is 256 K×9 bytes=2.331 MB. Then, the FIFO is emptied at a rate of (fill rate-burst rate)=450-40=410 MB/sec. Therefore, the FIFO will be full at 2.331 MB: 410 MB/sec~5.68 msec.

The number of cycles=fill time: tester cycle=5.68 msec: 20 nsec=284000 cycles. Assuming that the FIFO is used only for ¾ of its capacity, about ¼ (or about 70000 cycles) is left for a tester to stop or slow down its operation. Taking into account that a typical page lengh of a DRAM chip is about 1K or 2 K, this means that the FIFO is capable of operating adequately on the course of the test.

It will be appreciated that the above description and the figures are an example embodiment only and that various modifications may be made to the embodiment described above within the scope of the present invention.

What is claimed is:

1. A memory test system for testing a memory device, the test system comprising:

a central control unit;

a timing means for generating a pattern of addresses, data and control signals for accessing memory elements within the memory device;

a fault logic means for detecting failures in the memory elements; and a fault capture memory for storing fault information obtained at testing, including a high speed buffer memory and a low speed main memory, wherein the high speed buffer memory is operable so that as soon as the first portion of information about faults is received from the fault logic means, information transmission to the central control unit begins and the processing of the information in the main memory is started, while the timing means is signaled when the buffer memory is full or nearly full and stopped or slowed down except for a set of signals properly maintaining refresh intervals within the memory device.

2. A memory test system according to claim 1, wherein the buffer memory is selected from the group consisting of a FIFO type memory, a single buffer, a double buffer, a circular buffer memory.

3. A memory test system according to claim 1, wherein the timing means is operable so as when the testing of the device and writing the fault data into the buffer is postponed, information transmission from the buffer to the central control unit is maintained.

4. A memory test system according to claim 1, wherein the high speed buffer memory comprises a double buffer operable so that when the information about faults is received from the fault logic means by the first buffer, the second one can transmit the information to the central control unit.

5. A memory test system according to claim 1, wherein the fault capture memory further contains an encoding means for encoding the fault information by assigning each fault vector an identification tag for subsequently storing and transferring this tag along with a part of fault vector that differs from the previous fault vector.

6. A memory test system according to claim 5, wherein the timing system is connected with the buffer by means of a feedback line.

7. A method of testing a semiconductor device, including the steps of:

generating by a timing means a pattern of addresses, data and control signals for accessing memory elements within the device, detecting failures in the memory elements and processing the resulting fault information, including a step of a high speed processing in a buffer memory and a step of a low speed storing and/or displaying in the main memory, wherein the processing of the information is performed so that as soon as the first portion of information about faults is received by the buffer memory, information transmission to a central control unit begins, and the processing of the information in the main memory is started, while the step of generating a pattern of addresses, data and control signals further includes a step according to which the timing means is signaled when the buffer memory is full or nearly full and stopped or slowed down except for a set of signals properly maintaining refresh intervals within the memory device.

8. A method of testing semiconductor devices according to claim 7, wherein the buffer memory is selected from the group consisting of a FIFO type memory, a single buffer, a double buffer, a circular buffer memory.

9. A method according to claim 7, wherein the steps of generating by a timing means a pattern of signals for accessing memory elements within the device, and writing the fault data into the buffer is postponed when the buffer memory is full or nearly full, while the information transmission from the buffer to the central control unit is maintained.

10. A method according to claim 7, wherein the timing means reduces its speed when the failure memory is full or nearly full.

11. A method according to claim 7, wherein the fault information before transmission to a main memory is encoded in an encoding means by assigning each fault vector an identification tag for subsequently storing and transferring this tag along with a part of fault vector that differs from the previous fault vector.

12. A method according to claim 11, further comprising a step of decoding the fault information.

13. A method according to claim 11, wherein a step of decoding the encoded fault information is computer implemented.

14. A computer readable memory operable in a computer, comprising a computer program for implementing a method of testing a semiconductor device, including a computer readable program code means for generating a pattern of addresses, data and control signals for accessing memory elements within the device, a computer readable program code means for detecting failures in the memory elements and a computer readable program code means for processing the resulting fault information, including a computer readable program code means for high speed processing in a buffer memory and a computer readable program code means for low speed storing and/or displaying in the main memory, wherein the processing of the information is performed so that as soon as the first portion of information about faults is received by the buffer memory, information transmission to a central control unit begins, and the processing of the information in the main memory is started, while the computer readable program code means for generating a pattern of addresses, data and control signals further includes a program means according to which the timing means is signalled when the buffer memory is full or nearly full and stopped or slowed down except for a set of signals properly maintaining refresh intervals within the memory device.

15. A computer readable memory according to claim 14, further comprising a computer readable program code means for decoding fault information encoded by a hardware encoding means.

* * * * *